United States Patent
Myers

(10) Patent No.: US 6,628,932 B1
(45) Date of Patent: Sep. 30, 2003

(54) RADIO RECEIVER AUTOMATIC GAIN CONTROL TECHNIQUES

(75) Inventor: Michael H. Myers, Poway, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 565 days.

(21) Appl. No.: 09/677,317

(22) Filed: Sep. 29, 2000

(51) Int. Cl.[7] .................................................. H04B 1/06
(52) U.S. Cl. ........................ 455/234.1; 455/232.1; 455/234.2; 455/249
(58) Field of Search .................... 455/234.1, 234.2, 455/232.1, 249.1, 241.1, 246.1, 243.1, 245.1, 245.2

(56) References Cited

U.S. PATENT DOCUMENTS

| | | | | | |
|---|---|---|---|---|---|
| 3,631,344 A | * | 12/1971 | Greenwald | ............... | 455/249.1 |
| 4,580,287 A | * | 4/1986 | Richards, Jr. | ............ | 455/241.1 |
| 4,625,331 A | * | 11/1986 | Richardson et al. | ........ | 455/701 |
| 5,095,533 A | * | 3/1992 | Loper et al. | ............. | 455/249.1 |
| 5,175,882 A | * | 12/1992 | Higashijima | ............. | 455/234.1 |
| 5,507,023 A | * | 4/1996 | Suganuma et al. | ....... | 455/234.1 |
| 6,226,504 B1 | * | 5/2001 | Takagi | ..................... | 455/234.1 |
| 6,532,358 B1 | * | 3/2003 | Earls et al. | .............. | 455/234.1 |

* cited by examiner

Primary Examiner—Edward F. Urban
Assistant Examiner—Lana Le
(74) Attorney, Agent, or Firm—McAndrews, Held & Malloy, Ltd.

(57) ABSTRACT

An aviation radio receiver provides automatic gain control in three zones including an RF zone employing an RF attenuator (14), an intermediate frequency zone employing an intermediate frequency logarithmic attenuator (26) and a baseband zone implemented in a digital processor (30).

21 Claims, 1 Drawing Sheet

RADIO RECEIVER AUTOMATIC GAIN CONTROL TECHNIQUES

BACKGROUND OF THE INVENTION

This invention relates to radio receivers, and more specifically relates to automatic gain control techniques for such receivers.

Radio frequency (RF) and intermediate frequency (IF) automatic gain control (AGC) using quasi-logarithmic amplifiers controlled in hardware or software loops are commonly used in radios, including aviation radio receivers. Although such techniques have been useful in the past, they are inadequate to meet the new standards for aviation radios recently enacted. This invention addresses that need and provides a solution.

BRIEF SUMMARY OF THE INVENTION

The preferred embodiment is useful in a radio receiver in order to achieve automatic gain control. In such an environment, a radio frequency signal is received, is converted to a first signal and is down converted to an intermediate frequency signal. The intermediate frequency signal is converted to a second signal and also is down converted to a baseband signal. A first control signal is generated in response to the first signal and a second control signal is generated in response to the second signal. The first control signal limits the radio frequency signal to a first predetermined value, and the second control signal limits the intermediate frequency signal to a second predetermined value. Likewise, the baseband signal is limited to a third predetermined value.

By using the foregoing techniques, the gain of a radio receiver automatically can be controlled with a degree of accuracy previously unknown. Time constants may be set with increased flexibility, and interactions between the RF, IF and baseband AGC zones can be reduced. For radio frequency signals in the range of 118–137 MHz, the preferred embodiment can attenuate strong interferences within two MHz. For intermediate frequency signals of approximately 121.4 MHz, the preferred embodiment can be used to properly load an A–D converter over a 40 decibel dynamic range. Similarly, at baseband frequencies, at least 65 decibels of dynamic range over and above the radio frequency and intermediate frequency AGC can be provided.

According to another embodiment of the invention, by using digital processing, an AGC can be implemented in floating point arithmetic with unlimited dynamic range.

DETAILED DESCRIPTION OF THE PREFERRED EMBODIMENTS

Figure 1:
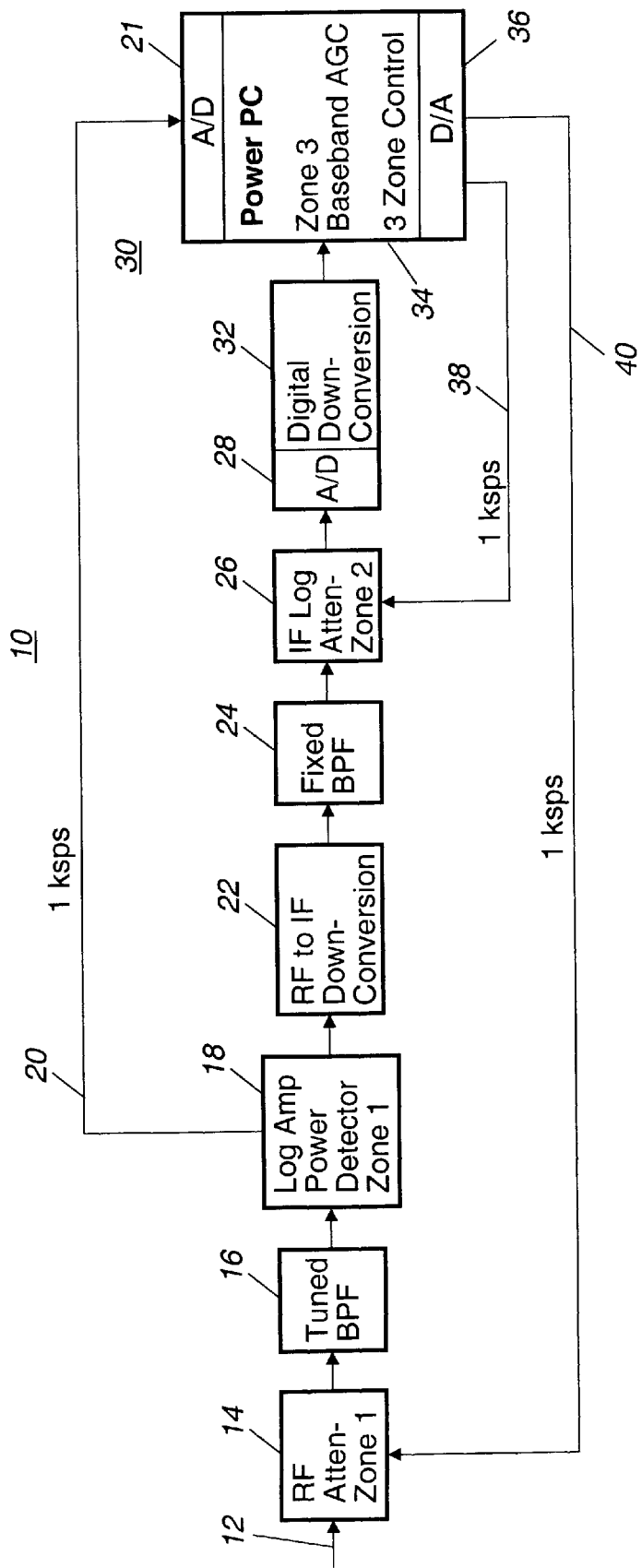
FIG. 1 is a schematic and functional block diagram of a preferred form of the present invention.

Referring to FIG. 1, a preferred form of aviation radio receiver 10 comprises a radio frequency attenuator 14 which receives a radio frequency input signal on a conductor 12. The radio frequency input signal comprises a carrier signal. The attenuated radio frequency (RF) signal is processed by a preselector comprising a tuned band pass filter 16. The filtered radio frequency signal is logarithmically sensed by a logarithmic amplifier power detector 18. The detected signal is transmitted over a conductor 20 to a 14-bit analog to digital converter which samples the detected signal on conductor 20 at a 1 kilosample per second rate.

The detected signal also is transmitted at radio frequency to an intermediate frequency (IF) down converter 22 which down converts the signal to a frequency of approximately 121.4 MHz The IF down converted signal then is passed through a fixed band pass filter 24 and is attenuated by an intermediate frequency log attenuator 26. The attenuated signal is transmitted to a 14-bit analog to digital converter 28 which samples at a 50 megasamples per second rate. The converted digital IF signal then is filtered for sampling at a 1 kilosample per second rate by a digital processor 30 which may comprise a digital signal processor, microprocessor, or a combination of other logic units capable of digital processing.

For example, processor 30 may comprise a signal processing field programmable gate array (FPGA) which performs the foregoing filtering function and then down converts the IF signal to a baseband signal as shown in block 32. Likewise, the processor may also include an 8240 power PC 34 which performs various operations. For example, processor 34 is responsive to the signal received from converter 21 to generate a first control signal useable by attenuator 14 to limit the radio frequency signal to a first value. The control signal is transmitted over a conductor 40 to attenuator 14 to form a second order control loop to maintain an output level no greater than −5 dBm into filter 16. Similarly, processor 34 is responsive to the IF signal from A to D converter 28 to generate a second control signal which is transmitted on a conductor 38 to attenuator 26 in order to form a second order control loop which maintains the input power to A to D converter 28 at a level 6 decibels below the maximum input to converter 28. The second control loop, including conductor 38, if desired, may utilize the known gain in the preceding RF attenuator 14 to reduce switching transients in the IF loop including conductor 38.

Processor 34 also performs an automatic gain control function on the baseband signal by normalizing a filtered estimate of baseband power in the signal bandwidth by means of a second order loop filter algorithm. The baseband AGC uses carrier energy predominantly and smoothes over the modulation. The baseband loop can, if desired, remove switching transients caused by the radio frequency and/or IF AGC loops by incorporating that knowledge into the filter. The previously described control loops are implemented using infinite impulse response (IIR) single pole filters with a selectable time constant of approximately 50 milliseconds.

The analog digital architecture partitioning required for integration has a dynamic range limited only by the floating point arithmetic used. In the preferred embodiments, single precision 32-bit arithmetic is used in processor 30. Since the RF, IF, and baseband control signals that need to be generated are orthogonal in the worst case, the triple zone solution described in the specification offers maximum flexibility in setting time constants and preventing zone to zone interactions.

Those skilled in the art will recognize that the preferred embodiments may be altered and modified without departing from the true spirit and scope of the invention as defined in the accompanying claims.

What is claimed is:

1. In a radio receiver, automatic gain control apparatus comprising in combination:

an input receiving a radio frequency signal comprising a carrier signal;

a first attenuator of the radio frequency signal;

a first converter arranged to convert the radio frequency signal to a first signal;

a second converter arranged to down convert the radio frequency signal to an intermediate frequency signal;

a second attenuator of the intermediate frequency signal;

a third converter arranged to convert the intermediate frequency signal to a second signal;

a processor arranged to downconvert the intermediate frequency signal to a baseband signal, responsive to the first signal to generate a first control signal usable by the first attenuator to limit the radio frequency signal to a first predetermined value, responsive to the second signal to generate a second control signal usable by the second attenuator to limit the intermediate frequency signal to a second predetermined value and responsive to the baseband signal to limit the baseband signal to a third predetermined value; and conductors arranged to transmit said first control signal to said first attenuator to form a first control loop and to transmit said second control signal to said second attenuator to form a second control loop.

2. A radio receiver, as claimed in claim 1, wherein said first converter comprises:

a logarithmic amplifier detector; and an analog to digital converter.

3. A radio receiver, as claimed in claim 2, wherein said third converter comprises an analog to digital converter.

4. A radio receiver, as claimed in claim 1, and further comprising a first band pass filter arranged to filter said radio frequency signal.

5. A radio receiver, as claimed in claim 4, wherein said processor generates said first control signal so that said first attenuator maintains an output level no greater the −5 dBm into said first band pass filter.

6. A radio receiver, as claimed in claim 4, wherein said processor generates said second control signal so that the average input power to the third converter is at least 6 dB below the maximum power into the third converter.

7. A radio receiver, as claimed in claim 4, wherein said processor uses a filtered estimate of said baseband power to limit the baseband signal.

8. A radio receiver, as claimed in claim 7, wherein said filtered estimate is based on carrier energy.

9. A radio receiver, as claimed in claim 4, and further comprising a second band pass filter for filtering said intermediate frequency signal.

10. A radio receiver, as claimed in claim 1, wherein said first control loop and said second control loop are second order loops.

11. A radio receiver, as claimed in claim 1, wherein said first control loop and said second control loop comprise infinite impulse response single pole filters.

12. A method of automatically controlling the gain of a radio receiver comprising in combination:

receiving a radio frequency signal comprising a carrier signal;

converting the radio frequency signal to a first signal;

downconverting the radio frequency signal to an intermediate frequency signal;

converting the intermediate frequency signal to a second signal;

downconverting the intermediate frequency signal to a baseband signal;

generating a first control signal in response to the first signal;

limiting the radio frequency signal to a first predetermined value in response to the first control signal;

generating a second control signal in response to the second signal;

limiting the intermediate frequency signal to a second predetermined value in response to the second control signal; and limiting the baseband signal to a third predetermined value.

13. A method, as claimed in claim 12, wherein said converting the radio frequency signal to a first signal comprises converting the radio frequency signal to a digital signal derived from logarithmic detection of said radio frequency signal.

14. A method, as claimed in claim 13, wherein said converting the intermediate frequency signal to a second signal comprises converting the intermediate frequency signal to a digital signal.

15. A method, as claimed in claim 14, wherein said generating a first control signal and a second control signal comprises generating by digital processing.

16. A method, as claimed in claim 15, and further comprising band pass filtering said radio frequency signal.

17. A method, as claimed in claim 16, wherein said limiting the radio frequency signal to a first predetermined value comprises limiting the radio frequency signal to a value no greater the −5 dBm before said band pass filtering said radio frequency signal.

18. A method, as claimed in claim 15, wherein said limiting the intermediate frequency signal to a second predetermined value comprises limiting the radio frequency signal to a value at least 6 dB below the maximum power of said intermediate frequency signal.

19. A method, as claimed in claim 15, wherein said limiting said baseband signal comprises using a filtered estimate of said baseband power to limit the baseband signal.

20. A method, as claimed in claim 19, wherein said using a filtered estimate comprises estimating based on the energy of said carrier signal.

21. A method, as claimed in claim 15, and further comprising band pass filtering said intermediate frequency signal.

* * * * *